US012672520B2

(12) United States Patent
Lee et al.

(10) Patent No.: US 12,672,520 B2
(45) Date of Patent: Jun. 30, 2026

(54) SUBSTRATE WARPAGE REDUCTION

(71) Applicant: Applied Materials, Inc., Santa Clara, CA (US)

(72) Inventors: Jooho Lee, Osan-si (KR); Youngho Kim, Seongnam-si (KR)

(73) Assignee: Applied Materials, Inc., Santa Clara, CA (US)

( * ) Notice: Subject to any disclaimer, the term of this patent is extended or adjusted under 35 U.S.C. 154(b) by 300 days.

(21) Appl. No.: 18/529,765

(22) Filed: Dec. 5, 2023

(65) Prior Publication Data

US 2025/0183091 A1 Jun. 5, 2025

(51) Int. Cl.
H10P 72/78 (2026.01)
H10P 72/00 (2026.01)
H10P 95/90 (2026.01)

(52) U.S. Cl.
CPC .......... H10P 72/78 (2026.01); H10P 72/0434 (2026.01); H10P 95/90 (2026.01)

(58) Field of Classification Search
CPC ...... H10P 72/0434; H10P 72/78; H10P 95/90; H10P 72/0432; H10P 72/72; H10P 72/7614
USPC .......................................................... 438/90
See application file for complete search history.

(56) References Cited

U.S. PATENT DOCUMENTS

2015/0332942 A1* 11/2015 Peh ..................... H10P 72/0434
165/61
2021/0074574 A1 3/2021 Ji et al.

2021/0344288 A1* 11/2021 Saito ...................... H02N 13/00
2022/0208523 A1* 6/2022 Long ................. H01J 37/32449
2023/0290611 A1* 9/2023 Benjamin .......... H01J 37/32119
2025/0051920 A1* 2/2025 Fukushi .............. C23C 16/4584

FOREIGN PATENT DOCUMENTS

| CN | 113874994 A | 12/2021 |
| JP | 2012199535 A | 10/2012 |
| KR | 20100008828 A | 1/2010 |
| KR | 1526615 B1 | 6/2015 |

OTHER PUBLICATIONS

International Search Report and Written Opinion dated Feb. 6, 2025 for Application No. PCT/US2024/052336.

* cited by examiner

*Primary Examiner* — Moazzam Hossain
(74) *Attorney, Agent, or Firm* — Patterson + Sheridan, LLP

(57) ABSTRACT

Embodiments disclosed herein include a processing system. The processing system includes a processing chamber, a processing volume; a substrate support assembly including a substrate support surface, a backside gas cavity, and a heater. The system includes a vacuum source in communication with the processing volume and the backside gas cavity. The system includes a backside gas resource in communication with the backside gas cavity. The system includes a controller, and the computer-readable instructions when executed by a processor of the controller cause: a delivery of electrical power to the heater of the substrate support assembly, a delivery of a series of vacuum pressure pulses the backside gas cavity, and a delivery of a series of backside gas pulses to the backside gas cavity where the series of vacuum pressure pulses and the series of backside gas pulses are alternately provided.

19 Claims, 6 Drawing Sheets

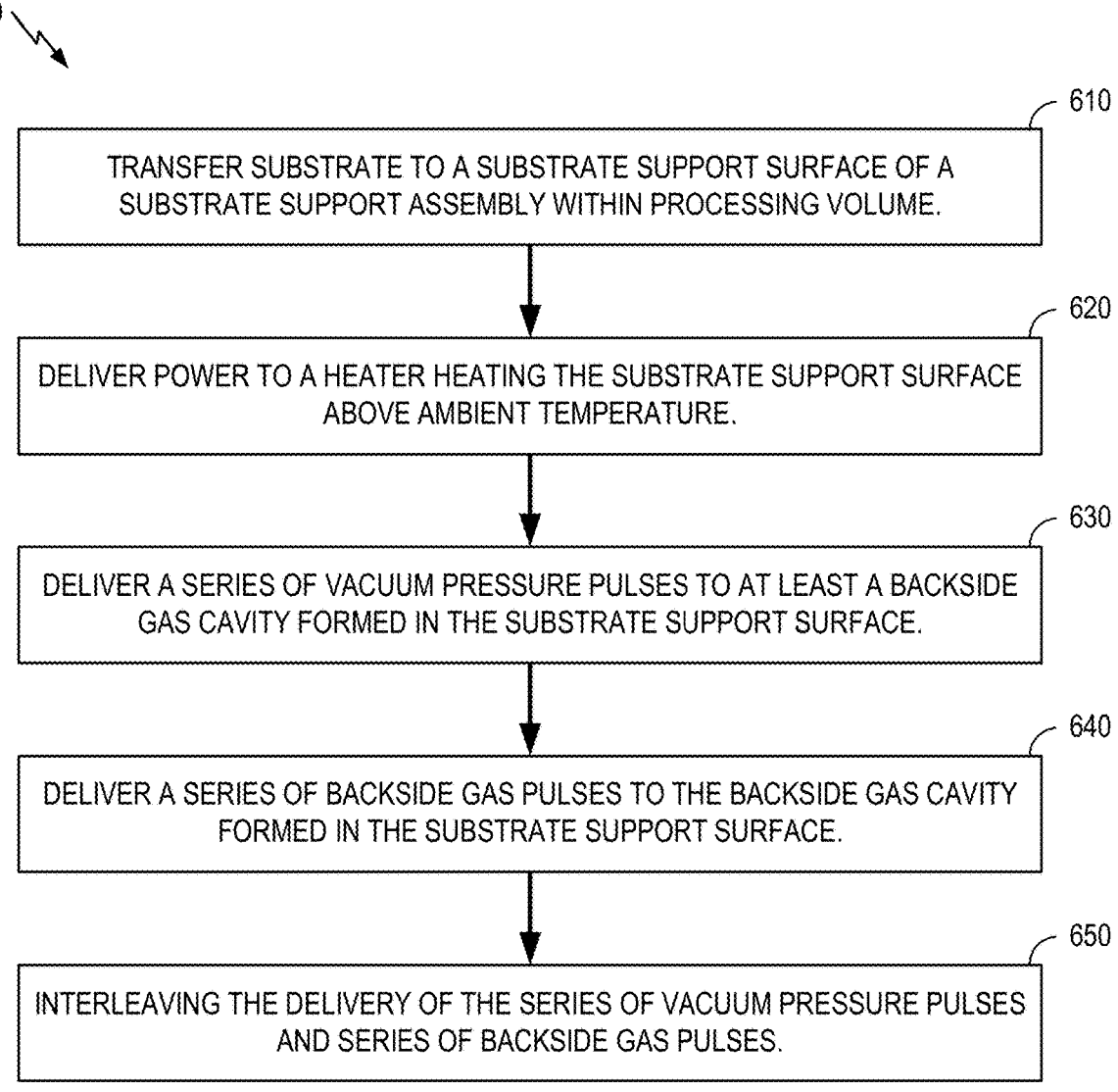

600

610
TRANSFER SUBSTRATE TO A SUBSTRATE SUPPORT SURFACE OF A SUBSTRATE SUPPORT ASSEMBLY WITHIN PROCESSING VOLUME.

620
DELIVER POWER TO A HEATER HEATING THE SUBSTRATE SUPPORT SURFACE ABOVE AMBIENT TEMPERATURE.

630
DELIVER A SERIES OF VACUUM PRESSURE PULSES TO AT LEAST A BACKSIDE GAS CAVITY FORMED IN THE SUBSTRATE SUPPORT SURFACE.

640
DELIVER A SERIES OF BACKSIDE GAS PULSES TO THE BACKSIDE GAS CAVITY FORMED IN THE SUBSTRATE SUPPORT SURFACE.

650
INTERLEAVING THE DELIVERY OF THE SERIES OF VACUUM PRESSURE PULSES AND SERIES OF BACKSIDE GAS PULSES.

FIG. 6

SUBSTRATE WARPAGE REDUCTION

BACKGROUND

Field

Embodiments of the present disclosure generally relate to stress control in substrates, and more particularly to stress compensation to reduce out-of-plane distortion in substrates.

Description of the Related Art

Memory devices are an essential component in digital electronic devices that are being developed today. With the increase in technology today, there is a need for increased memory capacity in most electronic devices. At the same time there is also a need for smaller memory devices to meet the market place's desire to create smaller electronic devices in which the memory device is positioned within.

In recent years, conventional (2D) NAND memory devices have run into a number of challenges, including voltage drop related issues (e.g., running out of electrons in the current carrying elements due to the ever scaling of the cell size), retention loss and overall reliability. To address these challenges encountered in scaling planar (2D) NAND memory devices to achieve higher densities at a lower cost per bit, ultra-high density, three-dimensional (3D) stacked memory structures have been introduced. Such 3D memory structures are sometimes referred to as having a Bit Cost Scalable (BiCS) architecture, and include strings of vertically integrated memory cells. Typically, the vertically aligned memory cells are formed from an array of alternating conductor and insulator layers, where the conductive layers correspond to the word lines of the memory structure.

As the number of vertically stacked memory cells in 3D NAND devices increases (e.g., as chip densities increase), the stress created within the stacked memory cells increases, which increase the substrate bow and introduces numerous substrate processing issues, which include wafer breakage and lithography and patterning issues to name just a couple of typical issues. Local variations in the intrinsic or extrinsic stress in the material layers within the vertically stacked memory cells can generate enough force to significantly deform or warp the semiconductor substrate. Substrate flatness, or warpage, has a very large influence on semiconductor device fabrication processes because of the impact it can have on the ability of photolithograph systems to effectively form device patterns on a surface of the substrate. Even moderate changes in surface topography within the area of the photolithograph exposure can alter the device feature patterns and, ultimately, lead to potential die yield loss. For accurate formation device patterns, it is important to form a pattern on a substrate while the substrate remains relatively flat or planar. Substrate warpage is also important for other related fabrication processes, since deformation or warping of a substrate may also cause difficulty in subsequent processing steps that may include chip dicing, bonding, or packaging.

Therefore, there is a need for a method that reduces the problems of warpage described above.

SUMMARY

Embodiments of the present disclosure generally relate to stress control in substrates, and more particularly to stress compensation to reduce out-of-plane distortion in substrates.

In one embodiment, a processing system is provided. The processing system includes a processing chamber may include one or more walls that define a processing volume; a substrate support assembly disposed within the processing volume, where the substrate support assembly further may include: a substrate support surface; a backside gas cavity formed in the substrate support surface; and a heater in communication with a power source. The system includes a vacuum source in communication with the processing volume, and in communication with the backside gas cavity. The system includes a backside gas resource in communication with the backside gas cavity. The system includes a controller may include a memory that includes computer-readable instructions stored therein, and the computer-readable instructions when executed by a processor of the controller cause: a delivery, by use of the power source, of electrical power to the heater of the substrate support assembly, where the delivery of electrical power generates a temperature above ambient temperature to be achieved the substrate support surface; a delivery, by use of the vacuum source, of a series of vacuum pressure pulses to at least the backside gas cavity, where the series of vacuum pressure pulses may include a vacuum pressure high time period and a vacuum pressure low time period; and a delivery, by use of the backside gas resource, of a series of backside gas pulses to the backside gas cavity, where the series of backside gas pulses may include a backside gas pressure high time period and a backside gas pressure low time period, where the series of vacuum pressure pulses and the series of backside gas pulses are alternately provided such that: the vacuum pressure high time period and the backside gas pressure low time period overlap in time; and the vacuum pressure low time period and the gas backside pressure high time period overlap in time.

In another embodiment, a method of reducing substrate warpage is provided. The method of reducing substrate warpage includes transferring a substrate to a substrate support surface a substrate support assembly, where the substrate support assembly is disposed within a processing volume, where the substrate support assembly further may include: a backside gas cavity formed in the substrate support surface; a vacuum source in communication with the processing volume, and in communication with the backside gas cavity; a backside gas resource in communication in the backside gas cavity; a heater, in communication with a power source. The method includes delivering, by use of a power source, of electrical power to the heater of the substrate support assembly, where the delivering of the electrical power generates a temperature above ambient temperature to be achieved the substrate support surface; delivering, by use of the vacuum source, of a series of vacuum pressure pulses to at least the backside gas cavity, where the series of vacuum pressure pulses may include a vacuum pressure high time period and a vacuum pressure low time period. The method includes delivering, by use of the backside gas resource, of a series of backside gas pulses to the backside gas cavity, where the series of backside gas pulses may include a backside gas pressure high time period and a backside gas pressure low time period, where the series of vacuum pressure pulses and the series of backside gas pulses are alternately provided such that: the vacuum pressure high time period and the backside gas pressure low time period overlap in time, and the vacuum pressure low time period and the gas backside pressure high time period overlap in time.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 6 illustrates a flow diagram of a method for reducing the warpage of a substrate, according to embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

As the number of vertically stacked memory cells in 3D NAND devices increases (e.g., as chip densities increase), the stress created within the stacked memory cells increases, which increase the substrate bow and introduces numerous substrate processing issues, which include wafer breakage and lithography and patterning issues to name just a couple of typical issues. Local variations in the intrinsic or extrinsic stress in the material layers within the vertically stacked memory cells can generate enough to significantly deform or warp the semiconductor substrate. Substrate flatness, or warpage, has a very large influence on semiconductor device fabrication processes because of the impact it can have on the ability of photolithograph systems to effectively form device patterns on a surface of the substrate. Even moderate changes in surface topography within the area of the photolithograph exposure can alter the device feature patterns and, ultimately, lead to potential die yield loss. For accurate formation device patterns, it is important to form a pattern on a substrate while the substrate remains relatively flat or planar. Substrate warpage is also important for other related fabrication processes, since deformation or warping of a substrate may also cause difficulty in subsequent processing steps that may include chip dicing, bonding, or packaging.

Example Deposition and/or Thermal Processing System

Figure 1:
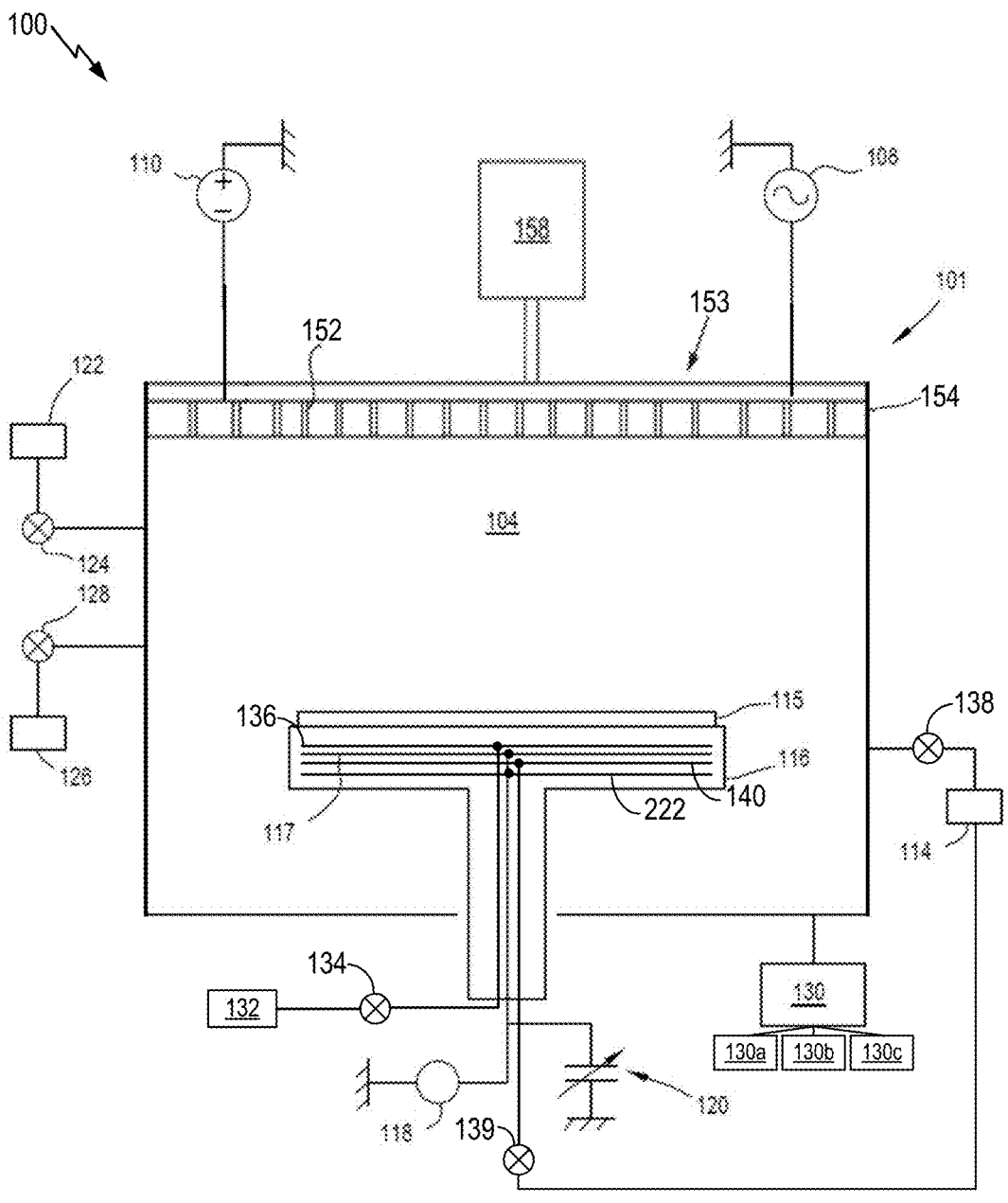
FIG. 1 illustrates a schematic view of a chemical vapor deposition processing system.

FIG. 1 illustrates a schematic view of a chemical vapor deposition (CVD) processing system 100, according to some embodiments. The CVD system 100 may be a first station within a first substrate processing line of a substrate processing system. The CVD system 100 may be used to perform the methods described herein. In some embodiments, the processing chamber 101 is configured to perform a CVD process. It is to be understood that the processing chamber 101 is an example of a CVD chamber and other types of deposition, etching or thermal processing chambers may be used. In one example, a pre-cleaning chamber, reactive ion etching (RIE) etching chamber, physical vapor deposition chamber, or other substrate processing system may be used to perform the methods described herein. In other embodiments, the deposition, etching or thermal processing chambers may be the first station within a cluster tool or substrate processing line.

The processing chamber 101 includes a chamber body 102 having a ceiling, sidewalls, and a bottom defining a processing volume 104. The processing chamber 101 further includes a showerhead 153 and a substrate support 116 (further described in FIG. 2), disposed within the processing volume 104. In some embodiments, a process gas resource 158 is configured to deliver a process gas through the openings 152 formed in a lower portion 154 of the showerhead 153 and into the processing volume 104 of the processing chamber 101.

The substrate support 116 is operable to secure (e.g., chuck) a substrate 115 to the substrate support 116. The substrate 115 may be a first substrate 115 of a sequential series of substrates processed by the CVD system 100. The substrate is disposed within the processing volume 104 during substrate processing operations. In some embodiments, the substrate support 116 includes an electrode 117 to chuck the substrate 115. In other embodiments the substrate support 116 uses vacuum to chuck the substrate 115.

The CVD system 100 further includes an RF power supply 108, a vacuum source 114 configured to provide a vacuum pressure resource to the processing volume 104 and/or the backside of the substrate 115, a controller 130, an auto capacitance tuner (ACT) 120, a power source 118, a reactive gas source 126, a process gas resource 122 configured to provide a process gas resource, a backside gas resource 132 configured to provide a backside gas resource to the backside surface of the substrate 115, a DC power source 110, and a magnetron assembly 111.

The showerhead 153 can be coupled to the RF power supply 108 and/or the DC power source 110. Power provided from RF power supply 108 and/or the DC power source 110 to the showerhead 153 can be used to ignite a plasma in the processing volume 104. The plasma is formed by a process gas. For example, the process gas may be a precursor gas or another type of gas, such as an argon (Ar), oxygen (O), hydrogen (H), fluorine (F), chlorine (Cl) containing gas or any combination thereof. Other reactive gases are also contemplated. The process gas is employed by the CVD system for depositing a layer on a surface of the substrate. The plasma may be created in the processing volume 104 by a plasma enhanced CVD process utilizing a capacitively coupled, or an inductive coupled source.

The vacuum source 114 is fluidly coupled to the processing volume 104. The vacuum source 114 is any device or assembly which may create a vacuum. For example, the vacuum source 114 is a vacuum pump. A vacuum pressure controller 138, such as a MFC, may be disposed between the vacuum source 114 and the processing volume 104. The vacuum pressure controller 138 maintains the processing volume 104 at a specified process pressure during processing operations. The vacuum source 114 also evacuates the process gases, reactive gases, and other gases from the processing volume 104.

The vacuum source 114 is additionally fluidly coupled to embedded vacuum channels 140. A vacuum pressure controller 139, such as a MFC, may be disposed between the vacuum source 114 and the embedded vacuum channels 140. The vacuum pressure controller 139 maintains the embedded vacuum channels 140 at a specified process pressure during processing operations.

The power source 118 is coupled to the electrode 117 in the substrate support 116. The electrode 117 induces an electrical bias on the substrate 115. The power source 118 may be a RF or DC power source. In some embodiments, a self-bias may form on the substrate 115 during processing. In some embodiments, the electrode 117 may be coupled to the ACT 120. The ACT 120 is operable to adjust the capacitance (and thus impedance) from the substrate support 116 to a ground. The power source 118 is coupled to the electrode 117 in the substrate support 116.

The reactive gas source 126 is fluidly connected to the processing volume 104. A reactive gas flow controller 128, such as a mass flow controller (MFC), may be disposed between a reactive gas source 126 and the process volume 104. The reactive gas flow controller 128 controls a flow of the reactive gas (e.g., oxygen) from the reactive gas source 126 to the processing volume 104.

The process gas resource 122 is fluidly connected to the processing volume 104. A process gas flow controller 124, such as a MFC, may be disposed between the process gas resource 122 and the processing volume 104. The process gas flow controller 124 controls a flow of the process gas (e.g., argon) from the process gas resource 122 to the processing volume 104.

The backside gas resource 132 is fluidly connected to backside gas cavity 136. A backside gas flow controller 134, such as a MFC, or other gas flow control device, may be disposed between the backside gas resource 132 and the backside gas cavity 136. The backside gas flow controller 134 controls a flow of the backside gas from the backside gas resource 132 to backside gas cavity 136 below the backside of the substrate 115. The backside gas may be any suitable gas. For example, the backside gas may be helium (He), neon (Ne), argon (Ar), krypton (Kr), xenon (Xe), nitrogen ($N_2$), or any combination thereof. Other gases are also contemplated.

The CVD system 100 further includes a controller 130. The controller 130 includes a programmable central processing unit (CPU) 130a which is operable with a memory 130b (e.g., non-volatile memory) and support circuits 130c. The support circuits are conventionally coupled to the CPU and comprise cache, clock circuits, input/output subsystems, power supplies, and the like, and combinations thereof coupled to the various components of CVD system 100, to facilitate control thereof. The CPU 130a is one of any form of general purpose computer processor used in an industrial setting, such as a programmable logic controller (PLC), for controlling various components and sub-processors of the processing system. The memory 130b, coupled to the CPU 130a, is non-transitory and is typically one or more of readily available memories such as random access memory (RAM), read only memory (ROM), floppy disk drive, hard disk, or any other form of digital storage, local or remote.

Typically, the memory 130b is in the form of a non-transitory computer-readable storage media containing instructions (e.g., non-volatile memory), which when executed by the CPU 130a, facilitates the operation of CVD system 100. The instructions in the memory 130b are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD)) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 130 may be used with one or any combination of the various systems described herein.

As used herein, 'a CPU,' "a processor," "at least one processor" or "one or more processors" generally refers to a single processor configured to perform one or multiple operations or multiple processors configured to collectively perform one or more operations. In the case of multiple processors, performance the one or more operations could be divided amongst different processors, though one processor may perform multiple operations, and multiple processors could collectively perform a single operation. Similarly, "memory," "at least one memory," or "or more memories" generally refers to a single memory configured to store data and/or instructions, multiple memories configured to collectively store data and/or instructions.

Example Substrate Support Assembly

Figure 2:
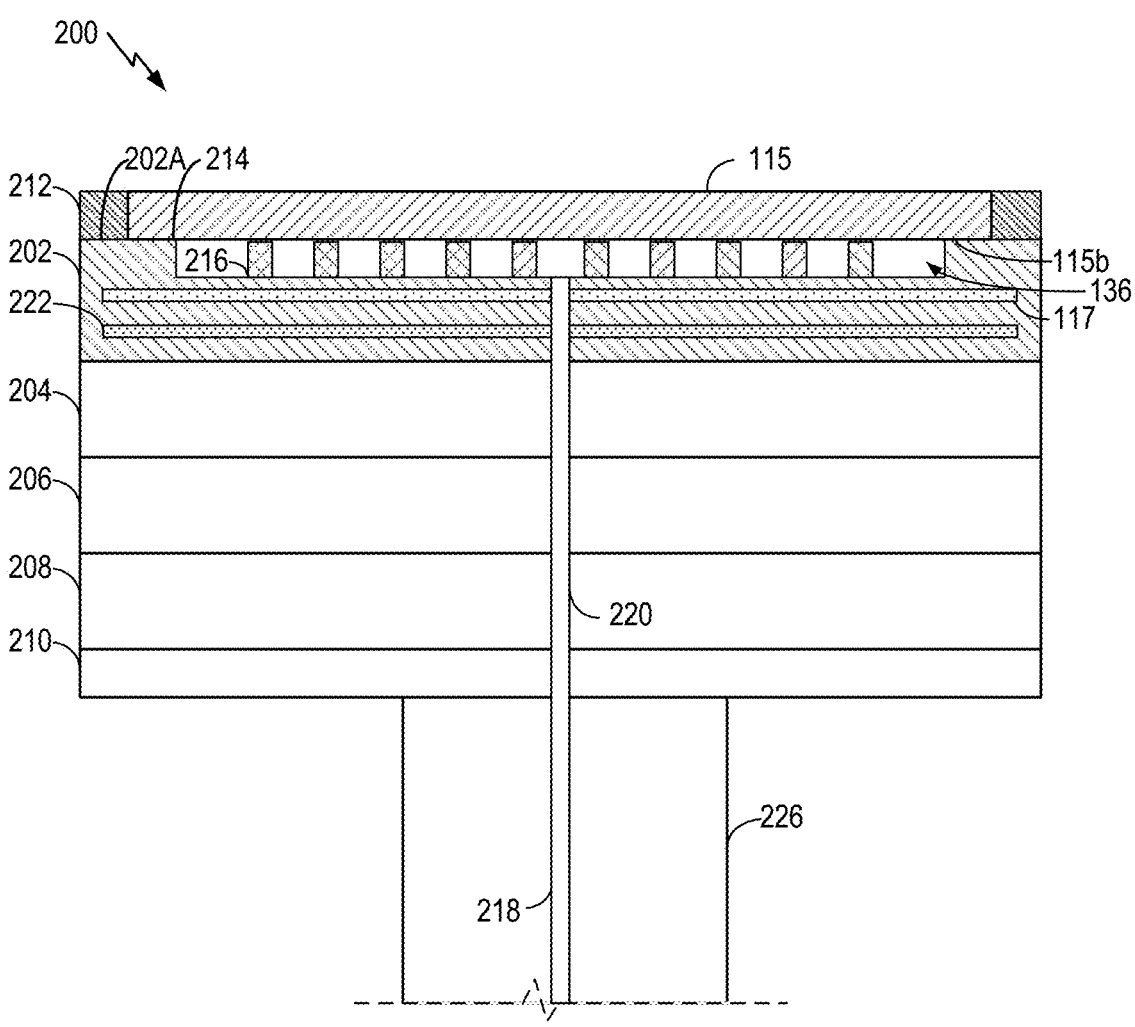
FIG. 2 illustrates a cross-sectional schematic view of an electrostatic chuck assembly.

FIG. 2 is a schematic cross-sectional view of a substrate support assembly 200 according to embodiments described herein. The substrate support assembly 200 includes the electrostatic chuck (ESC) 202, ESC base 204, facility plate 206, insulator plate 208, ground plate 210, edge ring 212, and substrate support column 226.

The electrodes 117 within the ESC 202 provide an electrostatic chucking force when electric power passes through the substrate 115 and ESC 202. The electric power passes through when a substrate lower surface 115b contacts the substrate support surface 214.

The substrate support surface 214 includes the top surface 202A of the ESC 202 and the tops of a plurality of posts 216 disposed within a backside gas cavity 136 of the ESC 103. The backside gas cavity 136 may be sealed or partially sealed from the processing volume 104 (FIG. 1) by the substrate support surface 214 and substrate lower surface 115b when chucked via the electrode 117.

The backside gas cavity 136 may be supplied and have gas exhausted through a backside gas conduit 218. The backside gas, filling the backside gas cavity 136, further aids thermal energy transfer between the ESC 103 and the substrate 115. The backside gas supplied by the backside gas conduit passes through a plug 220. In some embodiments the plug is disposed in the insulator plate 208.

The ESC base 204 may also include a heater 222 configured to provide a heat resource to the substrate support surface 214, and by conduction, substrate 115. Heater 222 may include a resistive heater or a fluid heater in embodiments. Heater 222 may include a polymer heater bonded or coupled with the chuck body material, although a conductive element may be embedded within the electrostatic chuck body and configured to receive electrical power (AC or DC power) from a power source to heat the substrate support surface 214, and by conduction, substrate 115, above ambient temperature at about a constant temperature. Heater 222 may include multiple heaters in embodiments, and each heater may be associated with a zone of the chuck body, and thus exemplary chuck bodies may include a similar number or greater number of zones than heaters.

The ESC base 204 may also be coupled to a vacuum source 114 that is configured to generate a vacuum pressure in the backside gas cavity 136 during one or more stages of processing. The vacuum source 114 may include a vacuum pump or other type of device that is coupled to and configured to generate a pressure in the backside gas cavity 136 that is lower than the pressure in the processing volume 104 during one or more phase of a process performed in the CVD system 100. In some embodiments, the ESC base may further include an embedded vacuum channel to provide a vacuum reservoir to allow the substrate 115 to be chucked. The embedded vacuum channels may be coupled to a vacuum conduit (not shown) that is coupled to the vacuum source. The vacuum pressure formed in the backside gas cavity 136 can be used to further aid in the substrate clamping process to the substrate support surface 214.

Substrate Warpage Examples

Figure 3A:
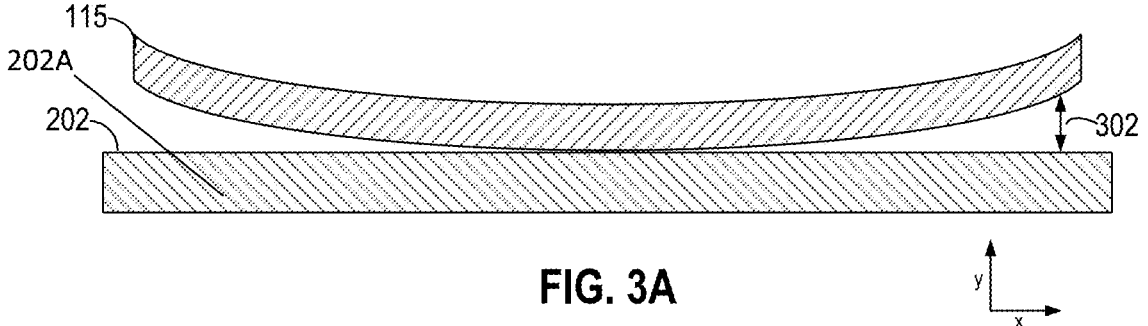
FIG. 3A illustrates a cross-sectional schematic view of substrate warpage.
Figure 3B:
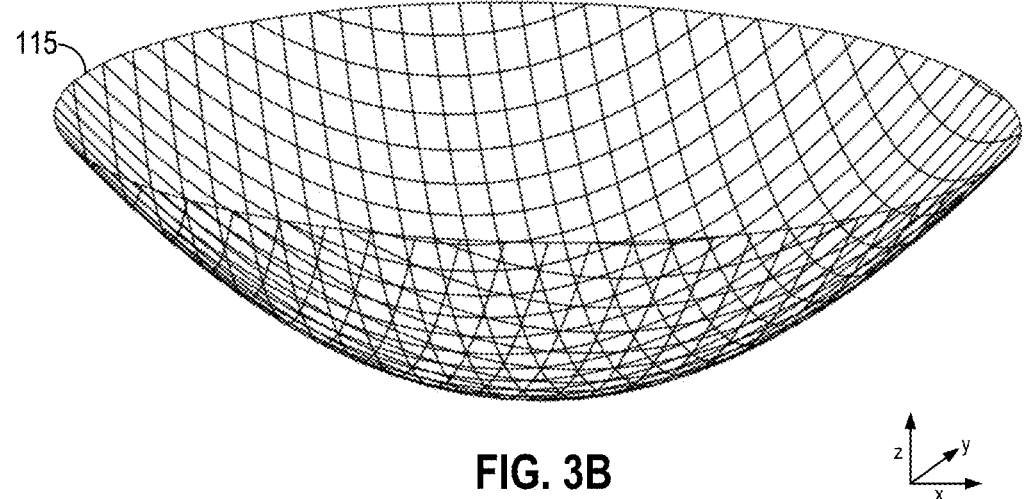
FIG. 3B illustrates a three-dimensional view of substrate warpage.

FIG. 3A illustrates a cross-sectional schematic view of a substrate 115 exhibiting warpage in a single axis. FIG. 3A includes the ESC 202 and a substrate 115. Generally, it is desirable for top and bottom surfaces of substrate 115 to be coplanar along the x-axis with the top surface 202A of the ESC 202. In this example, stress formed in the material within the substrate 115 have deformed the semiconductor substrate 115 along the y-axis, by a warpage distance 302, leading to an undesirable bow in the substrate 115. FIG. 3B illustrates a three-dimensional view of a substrate exhibiting warpage. FIG. 3B includes a substrate 115 exhibiting warpage in all three axes. The warpage of substrate 115 has been magnified for ease of viewing.

Figure 4:
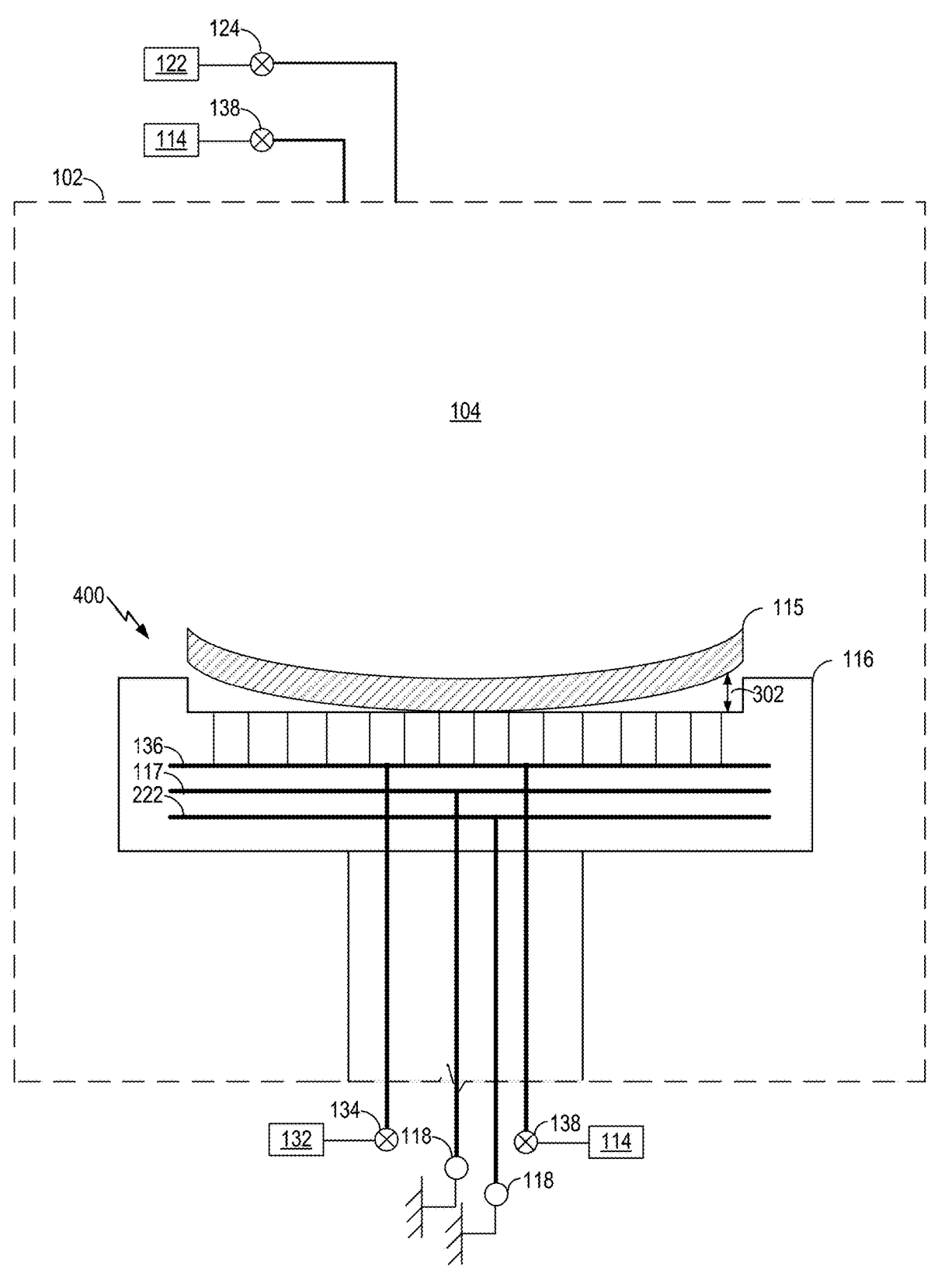
FIG. 4 illustrates a cross-sectional schematic view of a substrate support assembly according to embodiments described herein.

FIG. 4 illustrates a simplified cross-sectional schematic view of a substrate processing system 400. The substrate processing system 400 includes a partial view of chamber body 102 having chamber walls that define a processing volume 104, a substrate support 116, such as the substrate support assembly 200 described in FIG. 2, and substrate 115 exhibiting warpage having a warpage distance 302. The substrate processing system 400 includes a process gas resource 122, a vacuum source 114, a backside gas resource 132, and a power source 118. The substrate support 116 includes an electrode 117, a backside gas cavity 136, and a heater 222.

The process gas resource 122 is fluidly connected to the processing volume 104. The process gas flow controller 124, such as a MFC, may be disposed between the process gas resource 122 and the processing volume 104.

The vacuum source 114 is fluidly coupled to the backside gas cavity 136 and the processing volume 104. In some embodiments, the vacuum source 114 is also fluidly coupled to the backside gas cavity 136. A vacuum pressure controller 138, such as a MFC, is disposed between the vacuum source 114 and the backside gas cavity 136.

The backside gas resource 132 is also fluidly connected to the backside gas cavity 136. A backside gas flow controller 134, such as a MFC, or other gas flow control device, may be disposed between the backside gas resource 132 and the backside gas cavity 136.

A high voltage DC power source of the power source 118 is coupled to the electrode 117 in the substrate support 116. The electrode 117 induces an electrical bias on the substrate 115. The electrodes 117 within substrate support 116 provide an electrostatic chucking force when electrical power from the power source 118 is provided. The power source 118 may also include an AC power source that is coupled to the heater 222 in the substrate support 116. The heater 222 within substrate support 116 provide temperature regulation of the substrate 115 when power generated by the power source 118 is provided. In some embodiments, the electrical power from the power source 118 to the electrodes 117 may be delivered at a steady state providing a constant electrostatic chucking force to the substrate 115. In other embodiments, the electrical power from the power source 118 to the electrodes 117 may be delivered at as a series of electrical power pulses providing variable or intermittent electrostatic chucking force to the substrate 115.

Example Method Timing Diagram

Figure 5:
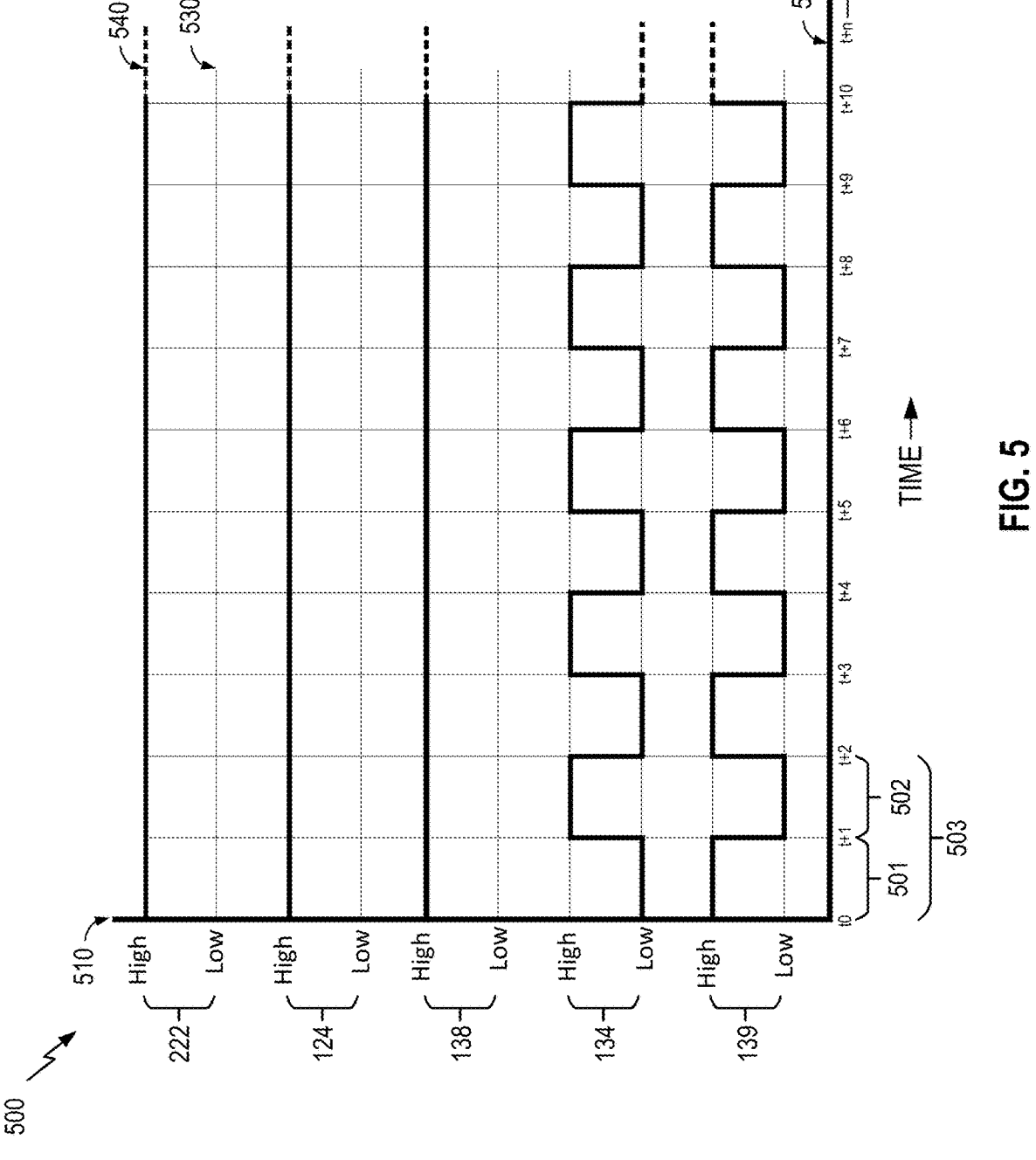
FIG. 5 illustrates a timing diagram, according to embodiments described herein.

FIG. 5 illustrates an example of a timing diagram 500 for a method for reducing the warpage of a substrate. Timing diagram 500 has two axes. A vertical axis 510, and a horizontal axis 520.

The vertical axis 510 tracks the state of five components. In this example, the states of the heater 222, the process gas flow controller 124, the vacuum pressure controller 138 connected to the processing volume 104, the backside gas flow controller 134, and the vacuum pressure controller 139 connected to at least the backside gas cavity 136.

The horizontal axis 520 represents a passage of time, with time incrementing from $t_0$ on the left, to $t_{+n}$ on the right along the horizontal axis 520. The passage of time includes at least a first configurable period of time 501, and a second configurable period of time 502 forming a time period 503. The ratio (or percentage, or fraction) of time during the time period 503 spent at a high-state 540 (e.g., ON), versus a low-state 530 (e.g. OFF), defines a configurable duty cycle. The first configurable period of time 501 is between about 0.1 seconds and about 5 seconds. For example, the first configurable period of time 501 is about 1 second. For example, the first configurable period of time 501 is about 1.5 seconds. The second configurable period of time 502 is between about 0.1 seconds and about 5 seconds. For example, the second configurable period of time 502 is about 1 second. For example, second configurable period of time 502 is about 1.5 seconds. In this embodiment, the first configurable period of time 501 and the second configurable period of time 502 are equal. In other embodiments, the first configurable period of time 501 and the second configurable period of time 502 may not be equal.

In timing diagram 500, the configurable duty cycle for the process variable controlled by each of the five supporting components, the heater 222, the process gas flow controller 124, the vacuum pressure controller 138, the backside gas flow controller 134, and the vacuum pressure controller 139, are shown as being equal (e.g., a 50% duty cycle). In practice, each of the five process variables controlled by the supporting components, such as the heater 222, process gas flow controller 124, vacuum pressure controller 138, backside gas flow controller 134, and the vacuum pressure controller 139, may each have a configurable duty cycle. The configurable duty cycle for each of the process variables, may, or may not, be equal to the configurable duty cycle for their controlled process variable provided from the different component.

Looking to the heater 222 as an example, a low-state 530 on timing diagram 500 would indicate that electrical power to the heater 222 is interrupted, or more commonly the controlled temperature set point is adjusted to a first temperature level. Conversely, a high-state 540 on timing diagram 500 indicates that electrical power is being delivered to the heater 222, or more commonly the controlled temperature set point is adjusted to a second temperature level, which is higher than the first temperature level. By alternating between the low-state 530 and the high-state 540 according to a configurable duty cycle, a series of first electrical power pulses are provided, or electrical current levels are adjusted to the heater 222.

A low-state on timing diagram 500 for the process gas flow controller 124 indicates that delivery of the process gas from the process gas resource 122 is to the processing volume 104 is interrupted. Conversely, a high-state on timing diagram 500 for the process gas flow controller 124 indicates that the process gas from the process gas resource 122 is being delivered to the processing volume 104. By alternating between the low-state and the high-state according to a configurable duty cycle, a series of process gas pulses is delivered from the process gas resource 122 to the processing volume 104.

A low-state on timing diagram 500 for the vacuum pressure controller 138 indicates that delivery of vacuum pressure from the vacuum source 114 is to the processing volume 104 is interrupted. Conversely, a high-state on timing diagram 500 for the vacuum pressure controller 138 indicates that the vacuum pressure from the vacuum source 114 is being delivered to the processing volume 104. By alternating between the low-state and the high-state according to a configurable duty cycle, a series of vacuum pressure pulses is delivered from the vacuum source 114 to the processing volume 104. The series of vacuum pressure pulses allows for the processing volume to be adjusted or maintained at about a constant pressure.

A low-state on timing diagram 500 for the backside gas flow controller 134 represents a backside gas pressure low time period indicating that backside gas from the backside gas resource 132 to the backside gas cavity 136 is interrupted. Conversely, a high-state on timing diagram 500 for the backside gas flow controller 134 represents a backside gas pressure high time period indicating that backside gas from the backside gas resource 132 is being delivered to the backside gas cavity 136. By alternating between the backside gas pressure low time period and the backside gas pressure high time period according to a configurable duty cycle, a series of backside gas pulses may be delivered from the backside gas resource 132 to the backside gas cavity 136

A low-state on timing diagram 500 for the vacuum pressure controller 139 represents a first vacuum pressure time period indicating that a first vacuum pressure generated by the vacuum source 114 and provided to at least the backside gas cavity 136 is being generated. Conversely, a high-state on timing diagram 500 for the vacuum pressure controller 139 represents a second vacuum pressure time period indicating that a second vacuum pressure generated by the vacuum source 114 is being delivered to at least the backside gas cavity 136, wherein the first vacuum pressure is a higher absolute pressure (e.g., closer to atmospheric pressure) than the second vacuum pressure. By alternating between the vacuum pressure low time period and the vacuum pressure high time period according to a configurable duty cycle, a series of vacuum pressure pulses may be delivered from the vacuum source 114 to at least the backside gas cavity 136.

The method for reducing the warpage of a substrate illustrated in the timing diagram 500 is as follows. In practice, the timing, arrangement, and sequence of events may differ from those illustrated in timing diagram 500.

At $t_0$, the following events occur. The heater 222 remains at, or is set to, a high-state indicates that electrical power is being delivered to the heater 222 to heat the substrate support surface 214, and by conduction, substrate 115, above ambient temperature. The process gas flow controller 124 remains at, or is set to, a high-state indicating that the process gas from the process gas resource 122 is being delivered to the processing volume 104. The vacuum pressure controller 138 remains at, or is set to, a high-state indicated that a vacuum pressure is being delivered, or maintained at a configurable vacuum pressure, from the vacuum source 114 to the processing volume 104. The backside gas flow controller 134 remains at, or is set to, a low-state. The vacuum pressure controller 139 remains at, or is set to, a high-state indicating that the vacuum pressure from the vacuum source 114 is being delivered to at least the backside gas cavity 136. The vacuum pressure of at least the backside gas cavity 136, being lower than the pressure of the processing volume 104, induces a downward force on the substrate flexing the substrate 115 toward the substrate support reducing the warpage distance 302.

At $t_{+1}$, the following events occur. The vacuum pressure controller 139 is set to a low-state indicating that delivery of vacuum pressure from the vacuum source 114 to at least the backside gas cavity 136 is adjusted upwards/interrupted and thereby releasing the downward force on the substrate 115. When the downward force on substrate 115 releases, substrate 115 begins to relax toward its original warpage distance 310. At approximately the same time, the backside gas flow controller 134 is set to a high-state indicating that backside gas from the backside gas resource 132 is being delivered to the backside gas cavity 136. The pressure within the backside gas cavity, being higher than the pressure of the processing volume 104, induces an upward force on the substrate flexing the substrate 115 away the substrate support increasing the warpage distance 302.

At $t_{+2}$, the following events occur. The backside gas flow controller 134 is set to a low-state indicating that backside gas from the backside gas resource 132 to the backside gas cavity 136 is interrupted and thereby releasing the upward force on substrate 115. When the upward force on substrate 115 releases, substrate 115 begins to relax too approximately toward its original warpage distance 310. At approximately the same time, the vacuum pressure controller 139 is set to a high-state indicating that a higher vacuum pressure generated by the vacuum source 114 is being provided to at least the backside gas cavity 136. The vacuum pressure generated in the backside gas cavity 136, being lower than the pressure of the processing volume 104, induces a downward force on the substrate flexing the substrate 115 toward the substrate support reducing the warpage distance 302.

At $t_{+3}$ through $t_{+n}$, the events of the time period 503 repeat, illustrating the delivery of a series of vacuum pressure pulses and a series of backside gas pulses in a manner such that the vacuum pressure high time period and the backside gas pressure low time period overlap in time, and the vacuum pressure low time period and the gas backside pressure high time period overlap in time. This alternating series of vacuum pressure pulses and backside gas pulses continues until the method for reducing the warpage of a substrate is complete. Over time, each successive application of upward and downward forces causes internal stresses in the substrate 115 to reduce. This results in a decrease in the warpage distance 302 over each successive cycle leaving a substrate 115 with an improved planar profile.

In other embodiments, the heater 222, process gas flow controller 124, vacuum pressure controller 138, power source 118, vacuum source 114 to the processing volume 104, or other resources may also be controlled according to a configurable duty cycle to provide a series of pulses, individually, or in combination to apply a force to the substrate 115 helping to reduce the warpage of a substrate.

Method Flow Diagram

FIG. 6 illustrates a flow diagram of a method 600 for reducing the warpage of a substrate. In one embodiment, method 600 is employed before, or after, a deposition process. In additional embodiments, method 600 is employed before, or after, a thermal process performed on a substrate. In additional embodiments, method 600 is employed before, or after, a dry etching process. The reduction in substrate warpage additionally allows for an improvement in the formation of device patterning and fabrication, improving yields. The reduction in substrate warpage also improves yields in subsequent processing steps that may include chip dicing, bonding, or packaging.

Operation 610 of method 600 includes transferring a substrate 115 to the substrate support surface 214 of a substrate support assembly 200 disposed within the processing volume 104 of a processing chamber 101.

As described above in FIGS. 1-2, and FIG. 4, the substrate support assembly 200 includes a backside gas cavity 136 formed in the substrate support surface 214. The backside gas cavity 136 is in communication with the backside gas resource 132. The substrate support assembly 200 includes a vacuum source 114 in communication with the processing volume 104, and in communication with the backside gas cavity 136. The substrate support assembly 200 includes a heater 222 in communication with a power source.

Operation 620 of method 600 includes delivering, by use of the power source 118, electrical power to the heater 222 of the substrate support assembly 200, wherein the delivery of electrical power generates a temperature above ambient temperature at the substrate support surface 214.

In some embodiments, alternating between a low-state and a high-state according to a configurable duty cycle, a series of first electrical power pulses can delivered to the heater 222 to control the temperature above ambient temperature at the substrate support surface 214. The configurable duty cycle of the series of first electrical power pulses include a first configurable period of time, and a second configurable period of time. During the first configurable period of time electrical power may be delivered to the heater 222 of the substrate support assembly 200, and during the second configurable period of time includes the electrical power to the heater of the substrate support assembly may be interrupted. In one example, as shown in FIG. 5, the temperature of substrate support, which is controlled by the heater 222, is held to a constant level (e.g., duty cycle is 100% at the high level) during the performance of the method.

Operation 630 of method 600 includes delivering, by use of the vacuum source 114, of a series of vacuum pressure pulses to at least the backside gas cavity 136, wherein the series of vacuum pressure pulses comprise a vacuum pressure high time period and a vacuum pressure low time period according to a configurable duty cycle. The configurable duty cycle of the series of vacuum pressure pulses to at least the first backside gas cavity 136 includes the first configurable period of time and the second configurable period of time. During the first configurable period of time (e.g., the vacuum pressure high time period), the vacuum pressure from the vacuum source 114 is delivered to at least the backside gas cavity 136 at a first vacuum pressure level. During the second configurable period of time, (e.g., vacuum pressure low time period), vacuum pressure from the vacuum source 114 to at least the backside gas cavity 136 is adjusted to a second vacuum pressure level. By alternating between the vacuum pressure high time period and the vacuum pressure low time period according to a configurable duty cycle, a series of vacuum pressure pulses may be delivered from the vacuum source 114 to at least the backside gas cavity 136.

Operation 640 of method 600 includes delivering by use of the backside gas resource 132, of a series of backside gas pulses to the backside gas cavity 136. The series of backside gas pulses includes a backside gas pressure high time period and a backside gas pressure low time period according to a configurable duty cycle. The configurable duty cycle of the series of backside gas pulses to at least the first backside gas cavity 136 includes the first configurable period of time and the second configurable period of time. During the first configurable period of time (e.g., the backside gas pressure high time period), backside gas from the backside gas resource is delivered to the backside gas cavity 136. During the second configurable period of time, (e.g., backside gas pressure low time period), backside gas from the backside gas resource 132 to the backside gas cavity 136 is interrupted. By alternating between the backside gas pressure high time period and the backside gas pressure low time period according to a configurable duty cycle, a series of vacuum pressure pulses may be delivered from the vacuum source 114 to at least the backside gas cavity 136.

Operation 650 of method 600 includes interleaving delivery of the series of vacuum pressure pulses and series of backside gas pulses. More specifically, operation 650 of method 600 delivering the series of vacuum pressure pulses and the series of backside gas pulses in a manner such that the vacuum pressure high time period and the backside gas pressure low time period overlap in time, and the vacuum pressure low time period and the gas backside pressure high time period overlap in time.

Each alternation between the vacuum pressure high time period and the backside gas pressure high time period each successively apply an alternation between an upward force and a and downward force of the substrate 115. Each successive application of upward and downward force causes internal stresses in the substrate 115 to reduce and/or relax, and results in a decrease in the warpage distance 302.

In other embodiments, operations 620-650 of method 600 may include the heater 222, process gas flow controller 124, vacuum pressure controller 138 being configured to be controlled to provide a series of pulses, individually, or in combination to apply an upward or downward force to the substrate 115 helping to reduce the warpage of a substrate 115.

As described above method 600 allows for reduction in substrate warpage improving the planarity of the substrate

115. Improved substrate 115 planarity allows for a reduction in chucking errors, improving production throughput. The reduction in substrate warpage additionally allows for an improvement in the formation of device patterning and fabrication, improving yields. The reduction in substrate warpage also improves yields in subsequent processing steps that may include chip dicing, bonding, or packaging.

ADDITIONAL CONSIDERATIONS

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate. While the various steps in an embodiment method or process are presented and described sequentially, one of ordinary skill in the art will appreciate that some or all of the steps may be executed in different order, may be combined or omitted, and some or all of the steps may be executed in parallel. The steps may be performed actively or passively. The method or process may be repeated or expanded to support multiple components or multiple users within a field environment. Accordingly, the scope should not be considered limited to the specific arrangement of steps shown in a flowchart or diagram.

Furthermore, any claimed implementation is considered to be applicable to at least a computer-implemented method; a non-transitory, computer-readable medium storing computer-readable instructions to perform the computer-implemented method; and a computer system including a computer memory interoperability coupled with a hardware processor configured to perform the computer-implemented method or the instructions stored on the non-transitory, computer-readable medium.

Unless defined otherwise, all technical and scientific terms used have the same meaning as commonly understood by one of ordinary skill in the art to which these systems, apparatuses, methods, processes and compositions belong.

In this disclosure, the terms "top", "bottom", "side", "above", "below", "up", "down", "upward", "downward", "horizontal", "vertical", and the like do not refer to absolute directions. Instead, these terms refer to directions relative to a nonspecific plane of reference. This non-specific plane of reference may be vertical, horizontal, or other angular orientation.

The singular forms "a," "an," and "the" include plural referents, unless the context clearly dictates otherwise. Within a claim, reference to an element in the singular is not intended to mean "one and only one" unless specifically so stated, but rather "one or more." Unless specifically stated otherwise, the term "some" refers to one or more.

Embodiments of the present disclosure may suitably "comprise", "consist" or "consist essentially of" the limiting features disclosed, and may be practiced in the absence of a limiting feature not disclosed. As used here and in the appended claims, the words "comprise," "has," and "include" and all grammatical variations thereof are each intended to have an open, non-limiting meaning that does not exclude additional elements or steps.

"Optional" and "optionally" means that the subsequently described material, event, or circumstance may or may not be present or occur. The description includes instances where the material, event, or circumstance occurs and instances where it does not occur.

As used, the term "determining" encompasses a wide variety of actions. For example, "determining" may include calculating, computing, processing, deriving, investigating, looking up, for example, looking up in a table, a database or another data structure, and ascertaining. Also, "determining" may include receiving, for example, receiving information, and accessing, for example, accessing data in a memory. Also, "determining" may include resolving, selecting, choosing, and establishing.

When the word "approximately" or "about" are used, this term may mean that there may be a variance in value of up to ±10%, of up to 5%, of up to 2%, of up to 1%, of up to 0.5%, of up to 0.1%, or up to 0.01%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as "first" and "second" are arbitrarily assigned and are merely intended to differentiate between two or more components of a system, an apparatus, or a composition. It is to be understood that the words "first" and "second" serve no other purpose and are not part of the name or description of the component, nor do they necessarily define a relative location or position of the component. Furthermore, it is to be understood that that the mere use of the term "first" and "second" does not require that there be any "third" component, although that possibility is envisioned under the scope of the various embodiments described.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims. In the claims, means-plus-function clauses are intended to cover the structures described as performing the recited function and not only structural equivalents, but also equivalent structures. It is the express intention of the applicant not to invoke 35 U.S.C. § 112(f), for any limitations of any of the claims, except for those in which the claim expressly uses the words 'means for' together with an associated function.

The following claims are not intended to be limited to the embodiments provided but rather are to be accorded the full scope consistent with the language of the claims.

What is claimed is:

1. A processing system, comprising:
a processing chamber comprising one or more walls that define a processing volume;
a substrate support assembly disposed within the processing volume, wherein the substrate support assembly comprises:
a substrate support surface;
a backside gas cavity formed in the substrate support surface; and
a heater in communication with a power source;
a vacuum source in communication with the processing volume, and in communication with the backside gas cavity;
a backside gas resource in communication with the backside gas cavity; and
a controller comprising a memory that includes computer-readable instructions stored therein, the computer-readable instructions when executed by a processor of the controller cause:
a delivery, by use of the power source, of electrical power to the heater of the substrate support assembly, wherein the delivery of electrical power generates a temperature above ambient temperature at the substrate support surface;
a delivery, by use of the vacuum source, of a series of vacuum pressure pulses to at least the backside gas cavity, wherein the series of vacuum pressure pulses comprises a vacuum pressure high time period and a vacuum pressure low time period; and
a delivery, by use of the backside gas resource, of a series of backside gas pulses to the backside gas cavity, wherein the series of backside gas pulses comprises a backside gas pressure high time period and a backside gas pressure low time period, wherein the series of vacuum pressure pulses and the series of backside gas pulses are alternately provided such that:
the vacuum pressure high time period and the backside gas pressure low time period overlap in time; and
the vacuum pressure low time period and the gas backside pressure high time period overlap in time.

2. The processing system of claim 1, wherein the backside gas resource is configured to provide a gas that comprises (He), neon (Ne), argon (Ar), krypton (Kr), nitrogen ($N_2$), and xenon (Xe).

3. The processing system of claim 2, further comprising a process gas resource configured to provide a gas to the process volume, wherein the process gas resource is configured to provide a gas that comprises argon (Ar), oxygen (O), hydrogen (H), fluorine (F), chlorine (Cl), or any combination thereof.

4. The processing system of claim 1, wherein the computer-readable instructions when executed by the processor of the controller further cause:
a delivery of a series of process gas pulses to the processing volume,
a delivery of one or more electrical power pulses to the heater, wherein each of the series of process gas pulses and the one or more electrical power pulses has a configurable duty cycle, wherein each configurable duty cycle comprises a first configurable period of time, and a second configurable period of time.

5. The processing system of claim 4, wherein the computer-readable instructions when executed by the processor of the controller further cause the first configurable period of time to be between 0.1 seconds to about 5 seconds.

6. The processing system of claim 4, wherein the computer-readable instructions when executed by the processor of the controller further cause the second configurable period of time to be between 0.1 seconds to about 5 seconds.

7. The processing system of claim 4, wherein the computer-readable instructions when executed by the processor of the controller further cause the first configurable period of time to be about 1 second to about 3 seconds.

8. The processing system of claim 4, wherein the computer-readable instructions when executed by the processor of the controller further cause the second configurable period of time to be about 1 second to about 3 seconds.

9. The processing system of claim 4, wherein the computer-readable instructions when executed by the processor of the controller further cause the configurable duty cycle to be about 100%.

10. The processing system of claim 4, wherein
during the first configurable period of time, a delivery of a process gas to the processing volume is performed, and
during the second configurable period of time, an interruption of the delivery of the process gas to the processing volume is performed.

11. The processing system of claim 4, wherein
during the first configurable period of time includes, a delivery by use of the power source of a first electrical power level to the heater of the substrate support assembly is performed, and
during the second configurable period of time, a delivery by use of the power source of a second electrical power level to the heater of the substrate support assembly is performed.

12. The processing system of claim 1, wherein the computer-readable instructions when executed by the processor of the controller further cause the series of backside gas pulses to the backside gas cavity to have a configurable duty cycle comprising a first configurable period of time and a second configurable period of time, wherein
during the first configurable period of time, a delivery by use of the backside gas resource of the series of backside gas pulses to the backside gas cavity is performed, and
during the second configurable period of time, an interruption of the delivery of the series of backside gas pulses to the backside gas cavity is performed.

13. The processing system of claim 1, wherein the computer-readable instructions when executed by the processor of the controller further cause the series of vacuum pressure pulses to at least the backside gas cavity to have a configurable duty cycle comprising a first configurable period of time and a second configurable period of time, wherein
during the first configurable period of time, a generation by the vacuum source of a first vacuum pressure to at least the backside gas cavity is performed, and
during the second configurable period of time, a generation by the vacuum source of a second vacuum pressure to at least the backside gas cavity is performed.

14. The processing system of claim 1, wherein the computer-readable instructions when executed by the processor of the controller further cause a series electrical power pulses to an electrode disposed within the substrate support assembly to have a configurable duty cycle comprising a first configurable period of time and a second configurable period of time, wherein during the first configurable period of time, a delivery by use of the power source of electrical power to the electrode of the substrate support assembly is performed, and during the second configurable period of time, an interruption of the electrical power to the electrode of the substrate support assembly is performed.

15. The processing system of claim 4, wherein the computer-readable instructions when executed by the processor of the controller further cause the process volume to remain at about a constant pressure while the series of vacuum pressure pulses and the series of backside gas pulses are being alternately provided.

16. The processing system of claim 4, wherein the computer-readable instructions when executed by the processor of the controller further cause the substrate support surface to remain at a constant temperature during the first configurable period of time and the second configurable period of time.

17. A method of reducing substrate warpage comprising:

transferring a substrate to a substrate support surface of a substrate support assembly, wherein the substrate support assembly is disposed within a processing volume, wherein the substrate support assembly further comprises:

a backside gas cavity formed in the substrate support surface;

a vacuum source in communication with the processing volume, and in communication with the backside gas cavity;

a backside gas resource in communication in the backside gas cavity;

a heater, in communication with a power source;

delivering, by use of the power source, electrical power to the heater of the substrate support assembly, wherein the delivering of the electrical power generates a temperature above ambient temperature at the substrate support surface;

delivering, by use of the vacuum source, a series of vacuum pressure pulses to at least the backside gas cavity, wherein the series of vacuum pressure pulses comprises a vacuum pressure high time period and a vacuum pressure low time period; and delivering, by use of the backside gas resource, a series of backside gas pulses to the backside gas cavity, wherein the series of backside gas pulses comprises a backside gas pressure high time period and a backside gas pressure low time period, wherein the series of vacuum pressure pulses and the series of backside gas pulses are alternately provided such that:

the vacuum pressure high time period and the backside gas pressure low time period overlap in time; and the vacuum pressure low time period and the gas backside pressure high time period overlap in time.

18. The method of claim 17, further comprising delivering a series of process gas pulses to the processing volume, wherein a configurable duty cycle of the series of process gas pulses comprises a first configurable period of time and a second configurable period of time, wherein the first configurable period of time coincides with the vacuum pressure high time period and the second configurable period of time coincides with the vacuum pressure low time period, wherein during the first configurable period of time, a process gas from a process gas resource is delivered to the processing volume; and during the second configurable period of time, the process gas to the processing volume from the process gas resource is interrupted.

19. The method of claim 17, further comprising delivering a series electrical power pulses to an electrode disposed within the substrate support assembly, wherein a configurable duty cycle of the series electrical pulses comprises a first configurable period of time and a second configurable period of time, wherein the first configurable period of time coincides with an electrical power high time period and the second configurable period of time coincides with an electrical power low time period, wherein:

during the first configurable period of time, a delivery of electrical power to the electrode of the substrate support assembly is performed; and during the second configurable period of time, an interruption of the electrical power to the electrode of the substrate support assembly is performed.

* * * * *